United States Patent [19]
Tanaka et al.

[11] Patent Number: 5,237,211
[45] Date of Patent: Aug. 17, 1993

[54] BIDIRECTIONAL SWITCH CIRCUIT WITH AUTOMATIC RETURN-CURRENT PATH SELECTOR

[75] Inventors: Minoru Tanaka, Yokohama; Hiroshi Tanimoto, Kawasaki, both of Japan

[73] Assignee: Kabushiki Kaisha Toshiba, Kawasaki, Japan

[21] Appl. No.: 792,926

[22] Filed: Nov. 15, 1991

[30] Foreign Application Priority Data

Nov. 15, 1990 [JP] Japan .................................. 2-307310
May 14, 1991 [JP] Japan .................................. 3-107881

[51] Int. Cl.⁵ .................................................. H03K 17/56
[52] U.S. Cl. ..................................... 307/249; 307/241; 307/242; 307/570; 379/413
[58] Field of Search ............... 307/241, 242, 254, 570, 307/571, 573; 361/245; 379/399, 413

[56] References Cited

U.S. PATENT DOCUMENTS

| | | | |
|---|---|---|---|
| 3,619,656 | 2/1971 | Domke | 307/632 |
| 3,731,182 | 5/1973 | Hirono et al. | 307/632 |
| 3,906,167 | 9/1975 | Baker | 379/413 |
| 4,041,255 | 8/1977 | Cambridge et al. | 379/399 |
| 4,069,446 | 1/1978 | Yonehara | 307/632 |
| 4,170,740 | 10/1979 | Pernyeszi | 307/251 |
| 4,350,949 | 9/1982 | Fujita | 307/255 |
| 4,429,186 | 1/1984 | Gartner | 379/413 |

OTHER PUBLICATIONS

ISPSD 1988, pp. 117-120; J. C. Gammel and M. A. Banak.
AT & T Bell Laboratories, Pa., 1988.

*Primary Examiner*—William L. Sikes
*Assistant Examiner*—Terry D. Cunningham
*Attorney, Agent, or Firm*—Oblon, Spivak, McClelland, Maier & Neustadt

[57] ABSTRACT

A bidirectional switch circuit includes a parallel circuit of two unidirectional switch devices which are connected between a first and a second external current terminals. These switch devices are arranged to be reverse to each other in their current-forwarding direction. The switch devices are electrically fed by a single power supply unit, and turn on alternately in accordance with the potential difference between the external terminals. Each switch device may be an insulated gate bipolar transistor (IGBT), which is driven by a bias voltage generator including a resistor. A return-current path selector is connected between the external terminals, and has an output connected to the power supply unit through a return path line. The selector automatically performs a return-path changeover operation for a return-current of one of the switch devices being presently turned on.

5 Claims, 4 Drawing Sheets

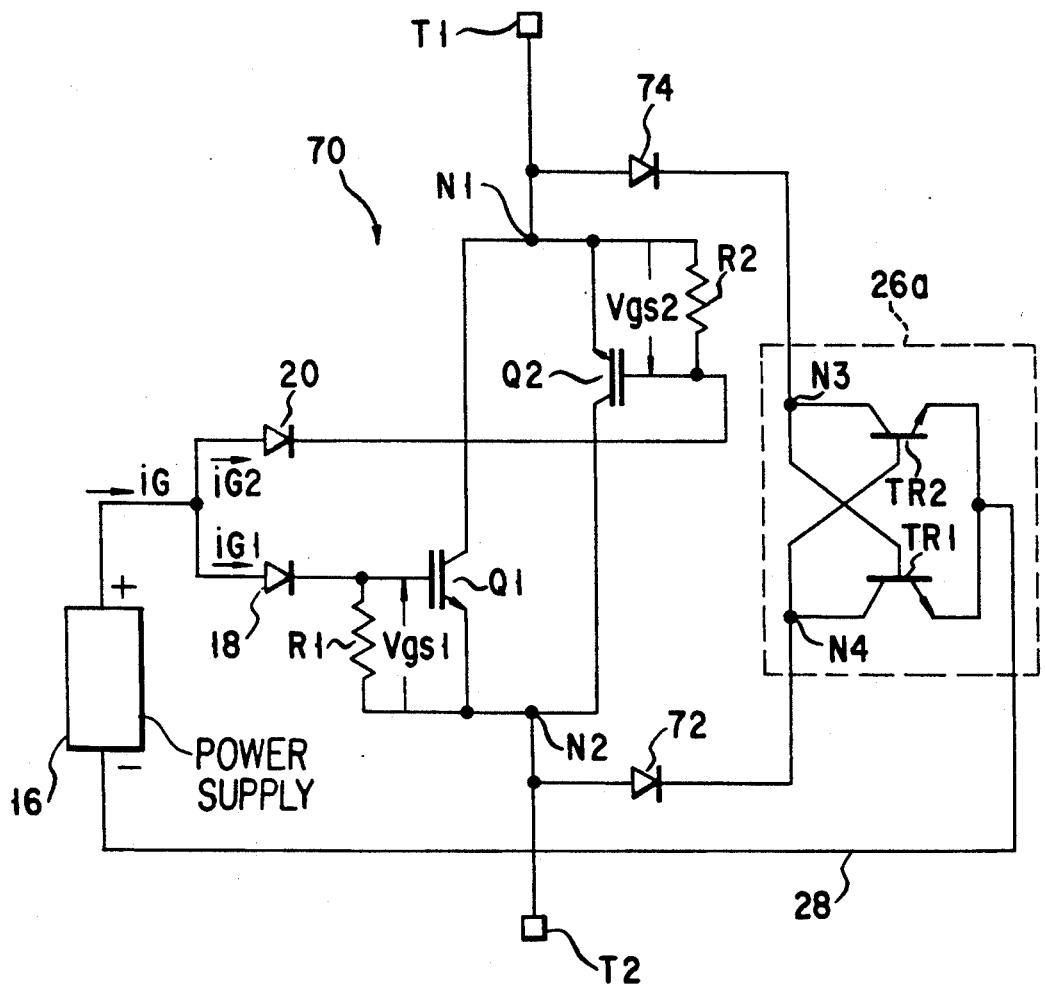
F I G. 7

BIDIRECTIONAL SWITCH CIRCUIT WITH AUTOMATIC RETURN-CURRENT PATH SELECTOR

BACKGROUND OF THE INVENTION

1. Field of the Invention

The present invention relates generally to integrated circuits, and more particularly to a bi-directional switch circuitry for use in a floating circuit system.

2. Description of the Related Art

Recently, bidirectional switch circuits are becoming more widely used in the floating circuit systems as the speed and cost advantages of these systems increase. Typically, in the subscriber line-interface circuit (SLIC), a bidirectional switch integrated circuit is very important to switch bidirectionally the transmission paths of communication signals between a private branch exchange (PBX) and a terminal unit such as a telephone.

In the floating circuit system, it is known that a pair of unidirectional switch devices are combined to achieve a bidirectional switch function. The paired unidirectional switch devices are connected in parallel with each other to have the reverse current-forward directions. Generally, these switch devices are provided with two separate power supply units as the current drivers therefor, respectively. The power supply units are same as each other in the circuit configuration thereof.

The conventional bidirectional switch circuits suffer from the following problem: The employment of two power supply units causes the switch circuit to increase in the number of circuit components required, which are mounted at higher integration density on a semiconductor chip substrate of limited size. Obviously, this necessitates the use of a larger substrate, which results in the manufacturing cost of the integrated circuit being increased.

SUMMARY OF THE INVENTION

It is therefore an object of the present invention to provide a new and improved bidirectional switch circuit which can perform an excellent switch function with the circuit arrangement being maximally simplified.

In accordance with this object, the invention is drawn to a specific bidirectional switch circuit adapted to be connected to a first and a second external terminal. The circuit comprises a first unidirectional switch device coupled between the first and second terminals, and a second unidirectional switch device connected in parallel with the first switch device to define the reverse current-forwarding directions to each other. A power supply unit is provided for electrically feeding or driving the first and second switch devices. The power supply unit includes a floating power supply circuit. A return-path selector is connected to the first and second terminals and has an output connected to the power supply unit, for automatically forming, when either one of the first and second switch devices turns on, a return path by which a return-current thereof is fed back to the power supply unit. The selector includes a third and a fourth switch device; these devices are responsive to the first and second switch devices and turn on exclusively.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIGS. 5 through 7 are diagrams showing bidirectional switch circuits in accordance with other embodiments of the present invention.

DETAILED DESCRIPTION OF THE PREFERRED EMBODIMENTS

Figure 1:
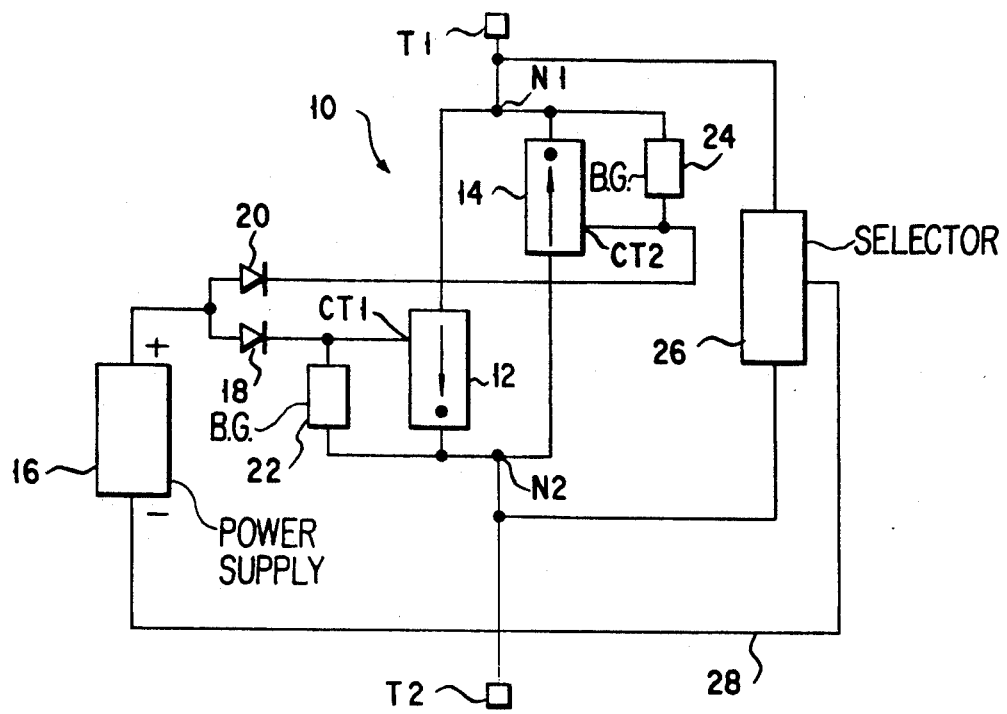
FIG. 1 is a circuit diagram of a bidirectional switch circuitry in accordance with one embodiment of the present invention.

Referring to FIG. 1, a bidirectional switch circuit in accordance with one preferred embodiment of the invention is generally designated by numeral "10." The switch circuit 10 includes first and second external current terminals T1 and T2, at which the circuit 10 is associated with an external floating circuit system (not shown). Terminals T1, T2 may be called the "control terminals." The term "floating" is defined as a specific electrical condition wherein a circuit node in question is DC-separated or electrically independent from another node. A pair of unidirectional switch devices 12, 14 are connected in parallel with each other between terminals T1, T2. Switch devices 12, 14 are opposite to each other in the current-forwarding (signal transmission) directions thereof. In FIG. 1 the current-forward directions of these devices are designated by arrows for the purposes of illustration only.

Each of the switch devices 12, 14 is a "one-way" or unidirectional current actuable device, which can control the flow of current in the forward direction only, and prevents the current flow in the reverse direction; in this sense, devices 12, 14 are called the "unidirectional" switches. When the first external terminal T1 is potentially greater than the second terminal T2, first switch device 12 becomes operative and turns on causing current to flow from terminal T1 to terminal T2. On the other hand, when second terminal T2 is potentially greater than first terminal T1, second switch 14 then turns on alternatively, causing current to flow from terminal T2 to terminal T1. First and second switches 12, 14 may be solid-state charge transistor devices, which include ordinary bipolar transistors and insulated gate bipolar transistors (IGBTs). Typically, the use of IGBTs is recommended in bi-directional switch circuit 10.

The bidirectional switch circuit 10 is provided with a single direct-current (DC) power supply unit 16 of the floating type. Power supply unit 16 is connected with the first and second unidirectional switch devices 12, 14 as follows. First and second switch devices 12, 14 have switching-control inputs CT1, CT2. Power supply unit 16 is connected to control inputs CT1, CT2 of switches 12, 14 via diodes 18, 20, respectively. These diodes function as current-backflow preventers.

The first and second switches 12, 14 are associated at their switch-control inputs CT1, CT2 with first and second bias-voltage generating circuits 22, 24. The bias voltage generator 22 is connected to control input CT1 of first switch 12 and external terminal T2, and is provided by power supply unit 16 with a switching-control current to generate a suitable bias voltage, which is then supplied to first switch 12. The other bias voltage generator 24 is connected to control input CT2 of second switch 14 and terminal T1, and receives a control current supplied by power supply unit 16, thereby to provide the second switch 14 with a bias voltage of selected potential level. When first terminal T1 is at a high voltage potential, diode 20 prevents the control current supplied by the power supply unit 16 from flowing in bias voltage generator 24 associated with second switch 14. On the other hand, when second terminal T2 is at the high potential, diode 18 prevents the control current from flowing in bias voltage generator 22 associated with first switch 12.

As shown in FIG. 1 a return-current path selecting circuit 26 is arranged between the first and second terminals T1, T2. In other words, this return-current path selector 26 is coupled between circuit nodes N1, N2 of the parallel-connected switch devices 12, 14 having reverse current-forwarding directions. Return-current path selector 26 is electrically driven by the power supply unit 16. Return-current path selector 26 is one of the circuit line (path) changeover-device; basically, it changes the internal circuit connection of bidirectional switch circuit 10 so as to facilitate the control current to flow back toward power supply unit 16 from one terminal T1 or T2, depending on which is potentially lower than the other. Under control of selector 26, the control current supplied by power supply 16 to first and second bias voltage generators 22, 24 can be successfully returned as a return-current to power supply 16. It is thus possible to prevent the control current flowing in bias voltage generators 22, 24 from leaking into an external signal transmission line-path that is connected with circuit 10 at terminals T1, T2.

Figure 2:
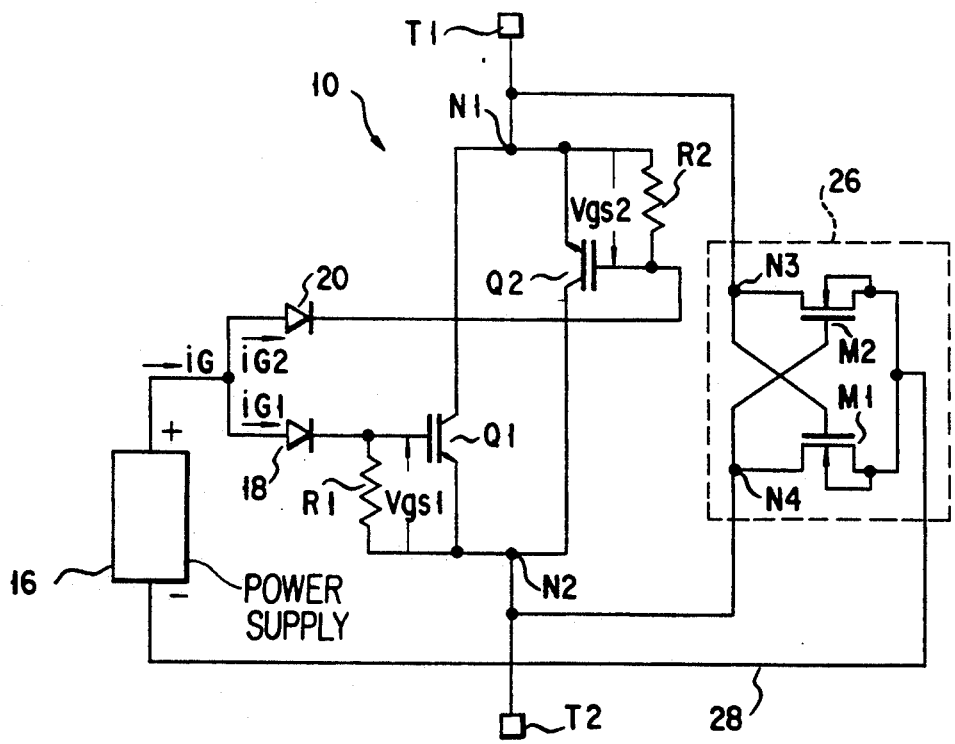
FIG. 2 is a diagram showing a detailed circuit configuration of the circuit of FIG. 1.

An exemplary circuit configuration of the bidirectional switch circuit 10 of FIG. 1 is shown in FIG. 2, wherein N-channel type insulated-gate bipolar transistors (IGBTs) Q1, Q2 are employed as the first and second switch devices 12, 14. Bias voltage generators 22, 24 are constituted using resistors R1, R2. Return-current path selector 26 may be a flip-flop circuit including two N-channel metal oxide semiconductor (MOS) transistors M1, M2. These transistors M1, M2 are connected at their source electrodes to the negative-polarity terminal of power supply 16. Transistors M1, M2 are cross-coupled with each other at the drain electrodes and the gate electrodes thereof, as shown in FIG. 2. A circuit node N3 (the drain electrode of transistor M2) is connected to the first terminal T1, while a circuit node N4 (the drain electrode of transistor M1) is connected to the second terminal T2. The output of return-current path selector 26 is connected to the negative-polarity terminal of power supply 16 via a current-flowing line 28, which acts as a return path for causing a return-current to flow back to power supply 16.

Figure 3:
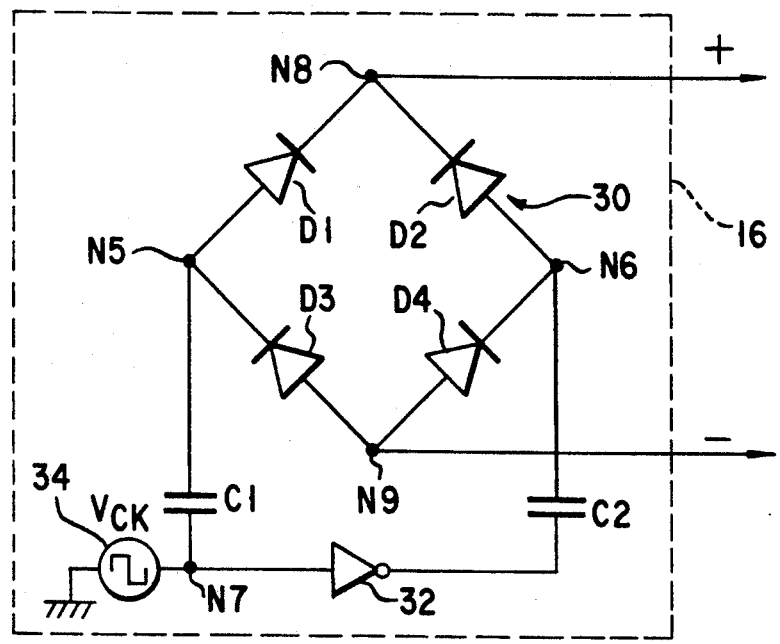
FIGS. 3 and 4 are circuit diagrams each showing the internal arrangement of a power supply unit employed in the circuit of FIG. 2.

As shown in FIG. 3, the power supply 16 includes a bridge circuit 30 consisting of four semiconductor diodes D1, D2, D3, D4. This bridge circuit 30 serves as a full-wave rectifier circuit. Two diagonally opposing nodes N5, N6 of bridge circuit 30 are input nodes. The input nodes N5, N6 are connected with a series circuit of two capacitors C1, C2 and an inverter 32, as shown in FIG. 3. A clock generator 34 is connected at its one end to a circuit node N7 between capacitor C1 and inverter 32, for generating a clock voltage Vck. The other end of clock generator 34 is grounded. Inverter 32 potentially inverts clock voltage Vck. The node N5 of bridge circuit 30 is thus applied with the clock voltage Vck through capacitor C1, whereas the node N6 is applied with the inverted clock voltage $\overline{Vck}$ through capacitor C2. The other two diagonally opposed nodes N8, N9 of bridge circuit 30 are output nodes, which are connected to diodes 18, 20 (see FIG. 1 or 2) and return-current path selector 26. By capacitors C1, C2, a DC control current iG may be supplied to the IGBTs Q1, Q2 of FIG. 2 serving as the first and second switch devices 12, 14 of FIG. 1, while causing these switch devices to be electrically floating from the external signal transmission line-path associated with switch circuit 10 at the first and second terminals T1, T2.

Figure 4:
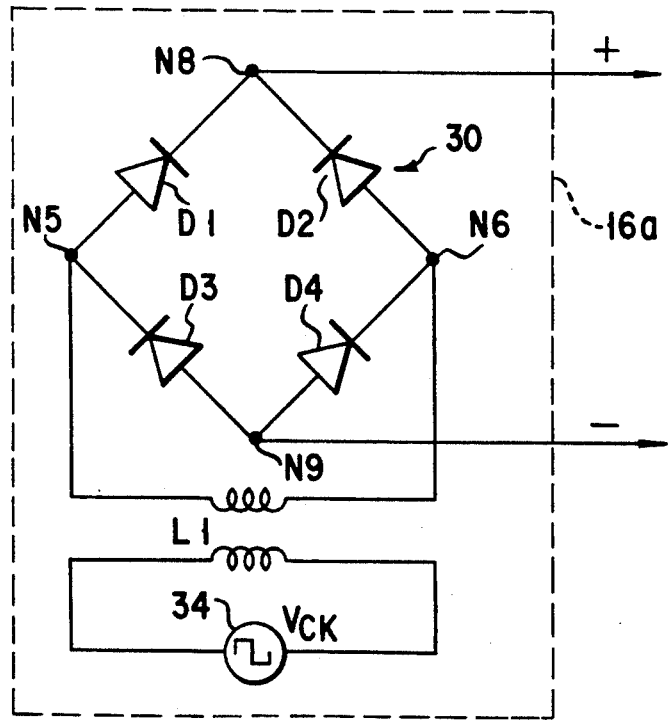

If required, another power supply unit 16a shown in FIG. 4 may be used alternatively. This power supply 16a is similar to that shown in FIG. 3 except for the following arrangement: The input nodes N5, N6 are coupled to the clock voltage generator 34 by a transformer L1, rather than by capacitors C1, C2. With the use of the transformer-coupling technique, it is possible to supply the bridge circuit 30 with the clock voltage Vck.

The operation of the bidirectional switch circuit 10 of FIG. 2 is as follows. The floating type DC power supply 16 constantly supplies a DC current iG to the IGBTs Q1, Q2 serving as the first and second switch devices 12, 14 of FIG. 1. When the first and second external terminals T1, T2 are potentially equal to each other, the flow of current iG is branched by parallel-connected diodes 18, 20 so that a switching-control current iG1 is supplied to the gate of first IGBT switch Q1, and a switching-control current iG2 is given to the gate of second IGBT switch Q2 as shown in FIG. 2. The resistors R1, R2 associated therewith supply IGBT switches Q1, Q2 with bias voltages Vgs1, Vgs2, respectively.

When a potential difference is generate between the first and second terminals T1, T2, either one of first and second IGBT switches Q1, Q2 is driven to turn on in accordance with the potential relationship between first and second terminals T1, T2. Assume that the bidirectional switch circuit 10 is initially inoperative (turned off), and that first terminal T1 is potentially greater than second terminal T2. Under such condition, diode 20 is reverse-biased. This may be easily understood by tracing a circuit path including terminal T1, node N1, resistor R2, diode 20, diode 18, resistor R1, node N2 and terminal T2 in this specific order. The output current iG of power supply 16 is forced to flow into resistor R1 only through diode 18 being presently forward-biased. As a result, a forward bias voltage Vgs1 is generated between the gate and the source of first IGBT switch Q1, causing only the IGBT switch Q1 to turn on. At this time, in return-current path selector 26, MOS transistor M1 is caused to turn on, while the other MOS transistor M2 being kept nonconductive (turned off). The control current iG1 flowing in resistor R1 is thus guided to flow into return-path line 28 via MO transistor M1 and is then fed back to power supply 16. In other words, when IGBT switch Q1 turns on, return-current path selector 26 automatically performs, in response to this turn-on operation of switch Q1, a return-path line changeover operation such that node N2 is connected to return-path line 28 while node N1 is electrically separated.

After the first IGBT switch Q1 is turned on, current begins to flow from terminal T1 to terminal T2 through IGBT switch Q1. IGBT switch Q1 exhibits its inherent on-voltage. Typically, this voltage ranges from 1.0 to 1.5 volts. With the existence of on-voltage, the potential difference between terminals T1, T2 will never drop to zero (the ground potential). However, when the potential at terminal T1 is further decreased, diode 20 will be forward-biased. In response to this, control current iG2 begins to flow in the other IGBT switch Q2 also. This current iG2 flows into resistor R2, and then into terminal T2 through IGBT switch Q1 that is kept conductive (turned on). As a result, forward-voltage Vgs2 is also generated between the gate and the source of second IGBT switch Q2. This switch Q2 does not turn on at this time, since the potential level at terminal T1 is maintained higher than that at terminal T2. Similarly, the control current flowing from the gate of IGBT switch Q2 to the circuit path between terminals T1, T2 flows into the return-path line 28 and is fed back to power supply unit 16.

The following discussion involves the case wherein the potential relationship between the first and second terminals T1, T2 is opposite to the above case, i.e., second terminal T2 is potentially greater than first terminal T1. Principally, the current-controlling operation in this case is substantially the reverse of that described above with respect to the transistors Q1, Q2, M1, M2, as will be explained below.

In response to the high voltage potential at second terminal T2, second IGBT switch Q2 turns on. At this time, MOS transistor M2 turns on, and MOS transistor M1 turns off in the return-current path selector 26. The control current iG2 supplied by power supply 16 via diode 20 is then returned to power supply 16 through resistor R2, node N1, node N3, MOS transistor M2, and return-path line 28 in this order. Switch circuit 10 is thus rendered operative, causing the potential at terminal T2 to drop gradually. This potential drop results in that some degree of current flows in resistor R1 which biases IGBT switch Q1; this current begins to flow in an external signal transmission circuit associated with the bidirectional switch circuit 10. Such current is also forced to return successfully to power supply 16 through MOS transistor M2 being rendered conductive.

With the above embodiment, the pair of unidirectional switch devices 12, 14 (Q1, Q2) for performing a bidirectional switch function can be electrically fed or powered by the single power supply unit 16. In addition, the return-current of switch devices 12, 14 which alternately turn on can be returned automatically and effectively to power supply 16 under the control of return-current path selector 26. It is thus possible to achieve the excellent bidirectional switch circuit 10 in a floating circuit system while minimizing the number of the circuit components being required therein. This can contribute to the improvement in high-density packaging of the bidirectional switch circuit 10 on a one-chip substrate.

Figure 5:
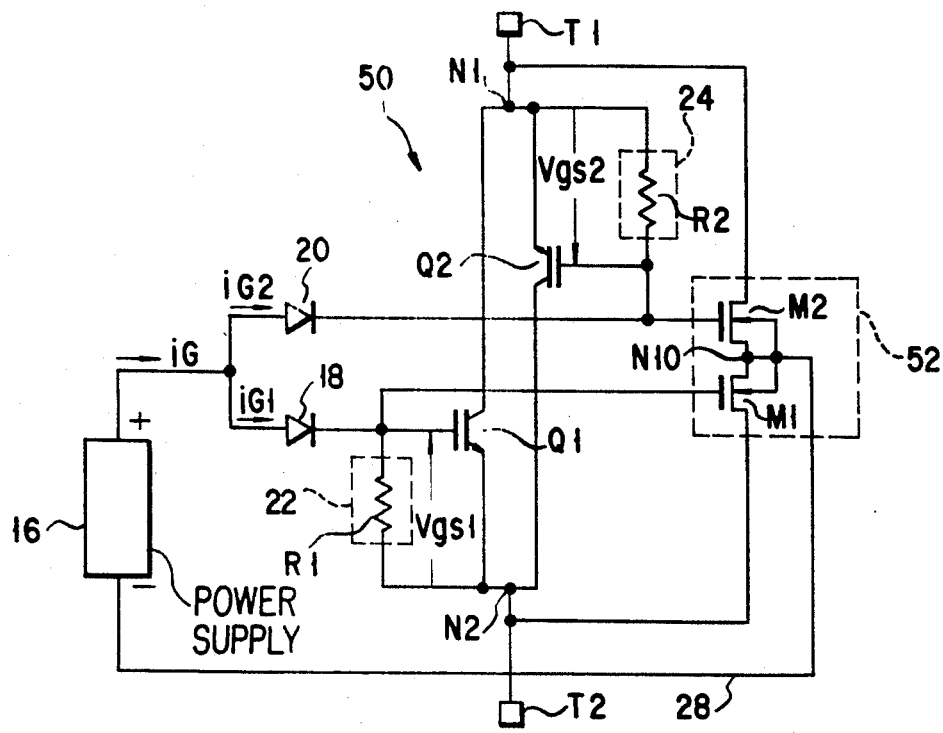

Another bidirectional switch circuit 50 is shown in FIG. 5, wherein the circuit 50 is similar to that of FIG. 2 with the return-current path selector 26 being replaced by a return-current path selector 52. The return-current path selector 52 is the same as the selector 26 of FIG. 2 in that it includes two MOS transistors M1, M2, but is different therefrom in the connection of these MOS transistors. As shown in FIG. 5, MOS transistors M1, M2 are connected in series with each other such that the source electrodes thereof are connected together at a circuit node N10. This common source node N10 is connected to the return-path line 28. The backgates of MOS transistors M1, M2 are coupled with each other at node N10.

Very importantly, both the gate electrode of MOS transistor M1 and that of IGBT switch Q1 are formed of a conductive layer; similarly, the gate electrode of MOS transistor M2 and that of IGBT switch Q2 are formed of a conductive layer. With such a common coupling feature, when a potential difference is generated between first and second terminals T1, T2, the one MOS transistors M1, M2 which is connected to a potentially lower one of the terminals T1, T2, begins to turn on. In other words, only one of MOS transistors M1, M2 which has its drain connected to the source of the presently conductive IGBT switch Q1, namely, transistor M1, is forced to turn on. With such an arrangement, a return-path for the control current iG, i.e., the return-current toward power supply 16 can be suitably selected in accordance with the alternate switch operation of the paired IGBT switches Q1, Q2.

The switch circuit 50 of FIG. 5 operates in the same manner as the circuit shown in FIG. 2 in that the control current flowing in IGBT switches Q1, Q2 is guided to flow in return-path line 28 via either one of MOS transistors M1, M2, and then return to power supply 16. Since MOS transistors M1, M2 are not arranged in the flip-flop circuit configuration, these transistors are controlled directly in response to a change in control currents iG1, iG2 flowing in IGBT switches Q1, Q2 respectively. When first terminal T1 is potentially greater than second terminal T2, diode 20 is rendered nonconductive causing the output current iG of power supply 16 to flow into the biasing resistor R1 through diode 18. A bias voltage is generated by resistor R2 and is then applied to MOS transistor M1 causing it to turn on. This bias voltage is also applied between the gate and drain of IGBT switch Q1, causing it to turn on. Accordingly, control current iG begins to flow in diode 18, resistor R1, node N2, MOS transistor M1, and return-path line 28 in this order, and then returns to power supply 16. When terminal T2 is potentially higher than terminal T1, MOS transistor M2 turns on alternatively, and, at the same time, IGBT switch Q2 turns on based on the same principle as in the above case. The control current is therefore caused to return to power supply 16 through diode 20, resistor R2, node N1, MOS transistor M12, and return-path line 28 sequentially.

Figure 6:
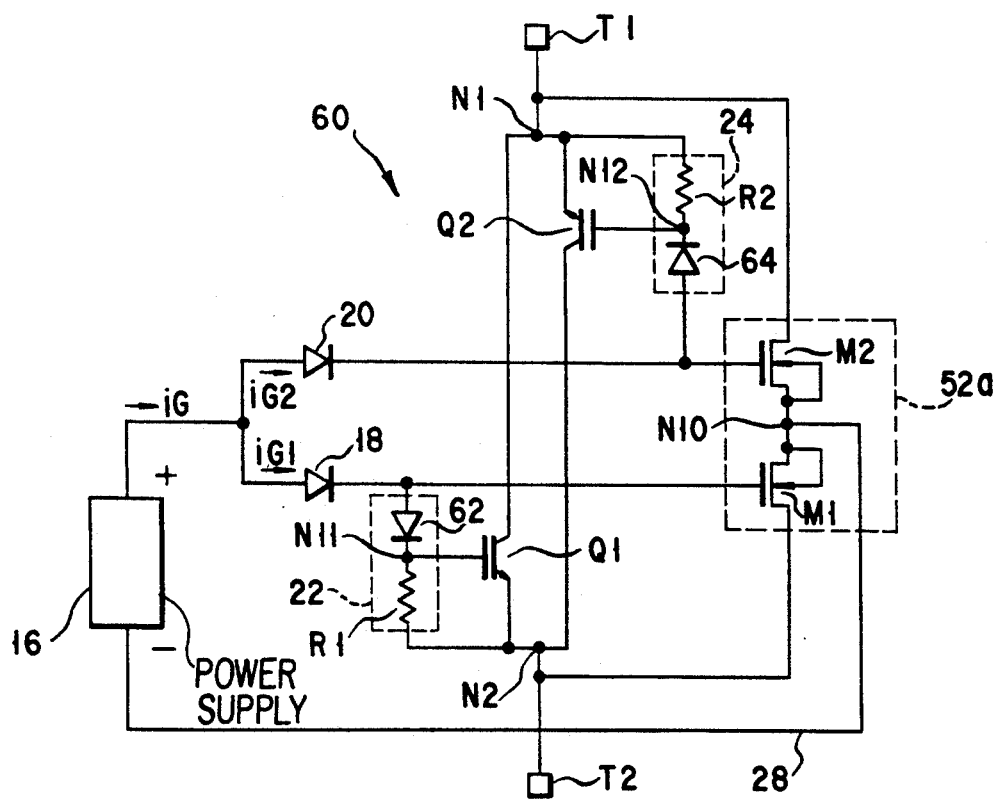

A still further bidirectional switch circuit 60 is shown in FIG. 6, wherein the circuit 60 is similar to that of FIG. 2 except for the following arrangements: (1) each bias voltage generator 22, 24 consists of a series circuit of resistor R1 and an additional diode 62, 64; and (2) a return-current path selector 52a includes series-connected MOS transistors M1, M2. Bias voltage generator 22 may be a series circuit of resistor R1 and diode 62, whereas bias voltage generator 24 may be a series circuit of resistor R2 and diode 64. The gate electrode of IGBT switch Q1 is connected to a circuit node N11 between resistor R1 and diode 62; the gate electrode of IGBT switch Q2 is connected to a node N12 between resistor R2 and diode 64. The gate-to-source voltage of each IGBT Q1, Q2 may thus be prevented from rising undesirably.

With such an arrangement, when the potential difference between the first and second terminals T1, T2 increases as a result of both IGBT switches Q1, Q2 being turned off, one of the biasing diodes 62, 64 which is connected to a potentially higher terminal T (T1 or T2) is rendered reverse-biased. It thus becomes possible to prevent any reverse-voltage of abnormally high potential from being applied to one of MOS transistors M1, M2, which has its gate electrode being presently connected to the reverse-biased diode 18 or 20. This can further enhance the breakdown voltage level of return-current path selector 52a. As a result, the bidirectional switch operations can be performed successfully even when voltage signals to be applied to the terminals T1, T2 are potentially increased.

The switch circuit 60 of FIG. 6 operates in much the same manner as the circuit of FIG. 5. The characteristic feature of circuit 60 is as follows: The breakdown level of MOS transistors M1, M2 can be enhanced by the presence of the additional diodes 62, 64. When terminal T1 is potentially higher than terminal T2, MOS transistor M1 and IGBT switch Q1 turn on. At this time, since the biasing diode 64 is reverse-biased and thus rendered nonconductive; this prevents any voltage from being applied to MOS transistor M2 which is presently turned off. MOS transistor M2 can thus be potentially protected. The same goes for the case wherein terminal T2 is potentially greater than terminal T1. In this case, the other biasing diode 62 is reverse-biased, thus protecting the gate electrode of MOS transistor M1.

A further bidirectional switch circuit 70 is shown in FIG. 7, which is the same as that shown in FIG. 2 except for the following arrangements: (1) a return-current path selector 26a includes a flip-flop circuit using NPN bipolar transistors TR1, TR2 in place of the MOS transistors M1, M2; and (2) protection-diodes 72, 74 are added to protect the NPN bipolar transistors TR1, TR2. More specifically, in return-current path selector 26a, NPN bipolar transistors TR1, TR2 are cross-coupled with each other at the collector electrodes and gate electrodes thereof. The emitter electrodes of these bipolar transistors TR1, TR2 are connected together to the return-path line 28. Diode 72 is added between terminal T1 and the collector of transistor TR1 as illustrated in FIG. 7. Diode 74 is inserted between terminal T2 and the collector electrode of transistor TR2 as shown in FIG. 7. Diodes 72, 74 may function to block the flow of reverse current from the base toward the collector of each transistor TR1, TR2 when a potential difference is generated between terminal T1, T2.

The present invention is not limited to the above-described specific embodiments and may be practiced or embodied in still other ways without departing from the spirit or essential character thereof. For example, the unidirectional switch devices used in the previously described circuits 10, 50, 60, 70 may be replaced with other types of transistors which are functionally equivalent thereto. Typically, switch devices 12, 14 may be NPN bipolar transistors. It is also possible to employ either PNP bipolar transistors as these switch devices 12, 14, if required. In such a case, the polarity of DC power supply unit 16 and diodes 18, 20 should be reversed with the MOS transistors M1, M2 of return-current path selectors 26, 26a, 52, 52a being replaced with P-channel type ones.

What is claimed is:

1. An integrated circuit for connection to a first and a second external terminal, said circuit comprising:
    a first unidirectional switch device coupled between the first and second terminals, said first switch device being turned on or off in accordance with a potential difference between said first and second terminal;
    a second unidirectional switch device connected in parallel with the first switch device, said second switch device being turned on or off in accordance with said potential difference between said first and second terminals the first and second switch devices being connected reverse to each other in a current-forwarding direction thereof;
    power supply means coupled to said first and second switch devices, said power supply means including a power supply unit of floating type;
    return-path selector means connected to the first and second terminals and having an output connected to said power supply means, for providing, in accordance with said potential difference between said first and second terminals, a return path by which a return-current thereof is fed back from said output to said power supply means, said return-path selector means including a third switch device and a fourth switch device which are turned on selectively such that while one of the third and fourth switch devices is turned on, the other of said third and fourth switch devices is turned off;
    diode means connected to said first and second switch devices, for receiving an output current of said power supply means, and for causing the output current to be provided unidirectionally to said first and second switch devices;
    bias means connected to said first and second switch devices, for providing said first and second switch devices with bias voltages respectively said first and second switch devices, for providing said first and second switch devices with bias voltages respectively in response to said output current of said power supply mean,
    wherein said first and second switch devices include transistors, and said third and fourth switch devices include transistors which are connected with each other to form a flip-flop circuit.

2. A circuit according to claim 1, wherein said flip-flop circuit has inputs connected to the external terminals and an output connected to said power supply means so as to define a return-current flow path.

3. A circuit according to claim 1, wherein said third and fourth switch devices are transistors which are selected from the group consisting of bipolar transistors and metal oxide semiconductor transistors.

4. A bidirectional switch circuit comprising:
    a parallel circuit of first and second unidirectional switch devices each having a control input, the first and second switch devices being connected so as to be opposite in current-forward direction to each other, said parallel circuit having first and second current terminals for connection to an external circuit which generates a signal current flowing through said first and second current terminals;
    a floating type DC power supply unit for supplying a control current to both of said first and second switch devices, the power supply unit having a current output connected to said first and second switch devices, and a current input connected to a current-return path through which the control current is fed back to said power supply unit;
    first diode means, inserted between the current output of said power supply unit and the control input of said first switch device, for allowing the control current to flow unidirectionally from said power supply unit to said first switch device;

second diode means inserted between the current output of said power supply unit and the control input of said second switch device, for allowing the control current to flow unidirectionally from said power supply unit to said second switch device;

first bias means coupled between the control input of said first switch device and the second current terminal, for electrically biasing said first switch device;

second bias means coupled between the control input of said second switch device and the first current terminal, for electrically biasing said second switch device; and return-current path selector means coupled between said first and second current terminals, for causing the control current flowing in said first and second bias means to be fed, back to said power supply unit, said return-current path selector means comprising a pair of switching transistors coupled to said first and second bias means respectively and having a common output coupled to said power supply unit, wherein said pair of switching transistors are cross-coupled to each other to form a flip-flop circuit.

5. A bidirectional switch circuit having a first and second signal current terminal and connected to a power supply section of floating type, said circuit comprising:

first unidirectional switch means coupled between the first and second terminals;

second unidirectional switch means connected in parallel with said first switch means, the first and second switch means being coupled opposite in current-forward direction to each other;

said first and second switch means selectively turning on when one of said first and second current terminals is set at a higher voltage potential than the other, causing a signal current to flow between the first and second terminals; and return-path selector means connected to the first and second terminals and having an output connected to the power supply section, for providing a return path by which a return-current thereof is fed back from said output toward said power supply section, said return-path selector means including two switch devices which are responsive to said first and second switch devices and turn on alternately such that while one of said two switch devices turns on, the other of said two switch devices turns off, wherein said third and fourth switch devices include bipolar transistors.

* * * * *